(12) United States Patent
Morizumi et al.

(10) Patent No.: US 6,459,588 B1
(45) Date of Patent: Oct. 1, 2002

(54) NONCONTACT IC CARD AND FABRICATION METHOD THEREOF

(75) Inventors: Ken-ichi Morizumi; Kazumi Izumitani, both of Tokyo-to (JP)

(73) Assignee: Dai Nippon Printing Co., Ltd. (JP)

( * ) Notice: Subject to any disclaimer, the term of this patent is extended or adjusted under 35 U.S.C. 154(b) by 0 days.

(21) Appl. No.: 09/508,064

(22) PCT Filed: Jul. 8, 1999

(86) PCT No.: PCT/JP99/03709

§ 371 (c)(1),
(2), (4) Date: Mar. 7, 2000

(87) PCT Pub. No.: WO00/03354

PCT Pub. Date: Jan. 20, 2000

(30) Foreign Application Priority Data

Jul. 8, 1998 (JP) .......................................... 10-192564

(51) Int. Cl.[7] ............................................... H05K 1/14
(52) U.S. Cl. ...................... 361/737; 361/760; 361/761; 361/764; 235/492; 343/751; 343/764; 343/853; 343/895; 343/855; 343/893
(58) Field of Search ................................. 361/737, 718, 361/764, 760, 761, 762; 235/492; 343/751, 764, 853, 895, 855, 893; 379/211.05

(56) References Cited

U.S. PATENT DOCUMENTS 5,892,661 A    4/1999  Stafford et al.
5,952,713 A  * 9/1999  Takahira et al. ............ 257/679

FOREIGN PATENT DOCUMENTS

| JP | 8-180160 | 7/1996 |
| JP | 8-216570 | 8/1996 |
| JP | 10-95188 | 4/1998 |
| JP | 10-193851 | 7/1998 |
| JP | 11-85937 | 3/1999 |
| JP | 11-96326 | 4/1999 |
| JP | 11-250214 | 9/1999 |

* cited by examiner

*Primary Examiner*—David Martin
*Assistant Examiner*—Thanh Yen Tran
(74) *Attorney, Agent, or Firm*—Parkhurst & Wendel, LLP (57) ABSTRACT

A noncontact IC card is provided with a card substrate 11, an IC chip 12 disposed on the card substrate 11, and a antenna circuit 13 formed on the card substrate 11 and having a pair of antenna terminals 13a and 13b, where one antenna terminal 13a is connected to the IC chip 12. An isolation layer 14 is formed over at least one portion of the antenna circuit 13, and a connection layer 15 is formed extending over the isolation layer 14. One end portion 15a of the connection layer 15 is connected to the IC chip 12 and another end portion 15b thereof is connected to the other antenna terminal 13b of the antenna circuit 13. Protective layers 16a and 16b are provided on top of the card substrate 11 to protect the IC chip 12 and the antenna circuit 13.

14 Claims, 7 Drawing Sheets

NONCONTACT IC CARD AND FABRICATION METHOD THEREOF

TECHNICAL FIELD

The present invention relates to a noncontact IC card that transfers data in a noncontact fashion to and from an external reader/writer, and a method of fabrication thereof.

BACKGROUND OF ART

With a prior-art noncontact IC card, a wound coil that is formed of windings of a thin conductive wire is attached to a card substrate, electronic components such as an IC chip and capacitor are mounted thereon, and then the card substrate is accommodated within a plastic casing; alternatively, a coil-pattern antenna is formed on the card substrate by direct plating or etching, electronic components such as an IC chip and capacitor are mounted thereon, and then the card substrate is sandwiched between plastic sheets or the like.

However, the above described wound-coil type of noncontact IC card of the prior art lacks flexibility and the card itself is thick, which degrades the portability thereof. The thickness of a noncontact IC card is set by ISO regulations to be 0.76±0.08 mm, but most wound-coil noncontact IC cards exceed 1 mm. They are also expensive.

A noncontact IC card with a pattern antenna formed by plating or etching requires a complex method of fabrication and is therefore expensive.

When a small IC chip is mounted, in particular, it is necessary to have a jumper wire that straddles the antenna circuit to ensure contact between the antenna terminals and the IC chip, and that jumper wire must be formed on the rear surface of the card substrate to prevent short-circuiting. Since that jumper wire has to make contact with the antenna circuit on the main surface through through-holes formed in the card substrate, the method of fabrication thereof is complicated. In addition, since this card substrate must be sandwiched between plastic sheets or the like, it is not suitable for mass-production.

If it is necessary to have a number of windings of the antenna coil, to ensure communications reliability, an antenna circuit is formed on each side of the card substrate, or the substrates, each having an antenna circuit have to be superimposed one after another and the end portions at the antenna circuits have to be connected by through-holes, so the method of fabrication thereof is complicated.

DISCLOSURE OF INVENTION

The objective of the present invention is to provide a noncontact IC card that can be made thinner and also inexpensive, and a method of fabrication thereof.

The present invention relates to a noncontact IC card comprising: a card substrate; an IC chip provided on one surface of the card substrate; an antenna circuit provided on the same surface of the card substrate as the IC chip and having a pair of antenna terminals, one antenna terminal being connected to the IC chip; an isolation layer provided so as to cover a portion of the antenna circuit; a connection layer provided on the isolation layer and having a pair of end portions, one end portion being connected to the IC chip and the other end portion being connected to the other antenna terminal; and a protective layer provided on top of the card substrate, for protecting the IC chip, the antenna circuit, and the connection layer, and the connection layer.

Another aspect of this invention applies to a noncontact IC card wherein the antenna circuit and the connection layer are formed by printing with a conductive ink; and the isolation layer is formed from an insulating ink.

A further aspect of this invention applies to a noncontact IC card which further comprises a capacitor connected to the antenna circuit, and provided on the same surface of the card substrate as the antenna circuit.

A still further aspect of invention applies to a noncontact IC card wherein the capacitor has a first electrode layer formed of a conductive ink, a dielectric layer formed of an insulating ink and provided on the first electrode layer, and a second electrode layer formed of a conductive ink and provided on the dielectric layer.

A yet further aspect of this invention applies to a noncontact IC card which further comprises an additional antenna circuit on the antenna circuit through an additional isolation layer.

An even further aspect of this invention applies to a noncontact IC card wherein the protective layer has a first protective layer disposed on the card substrate side and a second protective layer provided on the first protective layer.

Yet another aspect of this invention applies to a noncontact IC card wherein an aperture allowing the passage of the IC chip is provided in the first protective layer.

Still another aspect of this invention applies to a noncontact IC card wherein the first protective layer is a thermoadhesive sheet.

This invention also applies to a noncontact IC card which further comprises a pattern layer on outer sides of the card substrate and the protective layer.

This invention further applies to a noncontact IC card wherein the capacitor is disposed so as to be connected to one antenna terminal of the antenna circuit and one end portion of the connection layer.

This invention still further applies to a noncontact IC card wherein the capacitor is connected to one antenna terminal of the antenna circuit by a first linking layer and to one end portion of the connection layer by a second linking layer.

This invention even further applies to a noncontact IC card wherein the antenna circuit and the first electrode layer of the capacitor are disposed on the same plane surface, the isolation layer and the dielectric layer of the capacitor are disposed on the same plane surface, and the connection layer and the second electrode layer of the capacitor are disposed on the same plane surface.

This invention also applies to a method of fabricating a noncontact IC card having a card substrate with an IC chip, an antenna circuit, and a capacitor provided on the card substrate, in which the IC chip and the antenna circuit are connected by a connection layer on an isolation layer provided on said antenna circuit; wherein the fabrication method comprises a first conductive printing step of printing the antenna circuit and a first electrode layer onto predetermined locations of one surface of the card substrate; an insulation printing step of printing an isolation layer onto at least part of the antenna circuit that was formed by the first conductive printing step and also printing a dielectric layer on the first electrode layer that was formed by the first conductive printing step; and a second conductive printing step of printing a connection layer on the isolation layer that was formed by the insulation printing step and also printing a second electrode layer on the dielectric layer that was formed by the insulation printing step, to form the capacitor.

Finally, this invention also applies to a method of fabricating a noncontact IC card, further comprising a step of providing a protective layer on top of the card substrate, for

BEST MODE FOR CARRYING OUT THE INVENTION

First Embodiment

Embodiments of the present invention are described below in more detail, with reference to the accompanying drawings.

Figure 1:
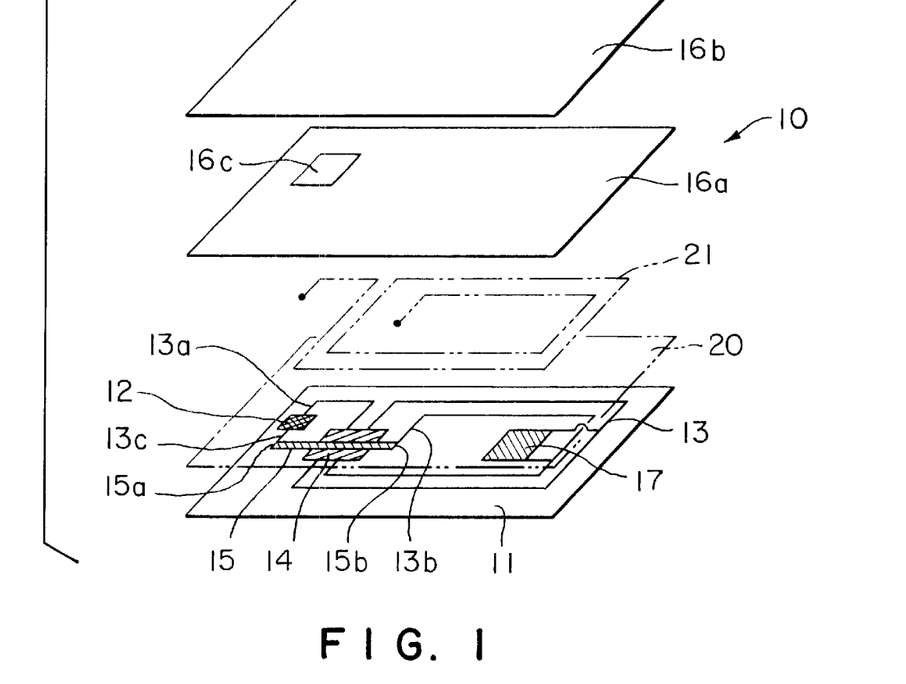
FIG. 1 is a perspective view of the structure of a first embodiment of a noncontact IC card in accordance with the present invention.

A perspective view of the structure of a first embodiment of the noncontact IC card of this invention is shown in FIG. 1.

A noncontact IC card 10 is provided with a card substrate 11, an IC chip 12, an antenna circuit 13, an isolation layer 14, a connection layer 15, a first protective layer 16a and a second protective layer 16b, and a capacitor 17. Of these, the IC chip 12, the antenna circuit 13, the isolation layer 14, the connection layer 15 are provided on one surface of the card substrate 11 and the first protective layer 16a and second protective layer 16b are provided so as to cover the IC chip 12, the antenna circuit 13, the isolation layer 14, the connection layer 15, and the capacitor 17.

The card substrate 11 is a component that acts as a support for this noncontact IC card. From considerations of thermal resistance, strength, and rigidity, the card substrate 11 could be fabricated from one material or a combination of materials selected as appropriate from materials including plastics such as nylon, cellulose diacetate, cellulose triacetate, vinyl chloride, polystyrene, polyethylene, polypropylene, polyesters, polyimides, or polycarbonates; paper; and impregnated paper. The thickness of the thus formed card substrate 11 could be selected as appropriate, from 0.005 mm to 5 mm by way of example.

The IC chip 12 is an integrated circuit comprising a CPU that performs computations, for example, and an EEPROM in which is stored a program and data to be manipulated by the CPU. The IC chip 12 is provided with a pair of terminals 12a (see FIG. 2).

The IC chip 12 is attached on top of the card substrate 11 with an anisotropic conductive contact film 18 therebetween.

The anisotropic conductive adhesive film 18 is configured of a conductive adhesive layer that is formed to extend over an antenna terminal 13a and an IC chip connection terminal 13c, which will be described later. The anisotropic conductive adhesive film 18 adheres to and holds the IC chip 12. In addition, when in a state in which a predetermined pressure is applied thereto, the anisotropic conductive adhesive film 18 becomes conductive only in the direction in which the pressure is applied; in a state in which pressure is not applied thereto, or in directions in which pressure is not applied, it does not become conductive.

Further details will be given later.

The antenna circuit 13 is a circuit formed by printing on top of the card substrate 11, to transfer data in a noncontact manner to and from an external reader/writer. The antenna circuit 13 can be formed by a method such as silk-screen printing, offset printing, or gravure printing. Such methods are advantageous from the cost point of view.

The antenna circuit 13 is printed in a coil form as shown in FIG. 1, antenna terminals 13a and 13b are provided at the ends of this coil, and the IC chip 12 and the connection layer 15 are connected together by the IC chip connection terminal 13c.

The antenna circuit 13 and the IC chip connection terminal 13c are formed by printing with an ink having conductive properties, such as an ink created by using a silver paste comprising 70% to 80% of silver particles in a thermosetting resin or a thermoplastic resin acting as a binder, by way of example.

Note that a resin binder (or ink vehicle) could also be used instead of the above described binder, such as a butyral resin, a vinyl chloride/vinyl acetate copolymer resin, a urethane resin, a polyester resin, a cellulose resin, an acrylic resin, a styrene/maleic copolymer resin, an epoxy resin, or the like; and, if necessary, a rubber-based resin such as nitrile rubber or a urethane elastomer could be added thereto. From considerations of thermal resistance, it is possible to use a resin that exceeds the glass transition temperature (Tg) such as a polyamide, polyimide, or polyether sulphur, or one that exceeds even Tg due to a hardening reaction. A surfactant, a silane coupling agent, a plasticizer, a wax, or a silicon oil could be added to the above described resin or ink vehicle if necessary.

Instead of a silver paste, a paste comprising copper particles or a carbon filler in a binder resin that is similar to that described above, or a paste of silver or copper particles mixed into a carbon filler, could be used as the conductive ink.

The antenna terminal 13a of the antenna circuit 13 is connected to the IC chip 12 and the other antenna terminal 13b thereof is connected to the connection layer 15. The connection layer 15 is connected to the IC chip connection terminal 13c and the IC chip connection terminal 13c is connected to the IC chip 12.

In this manner, the antenna circuit 13 forms a circuit for transferring data to and from the IC chip 12.

The isolation layer 14 is a layer that is formed so as to cover part of the antenna circuit 13, to insulate between the antenna circuit 13 and the connection layer 15. The isolation layer 14 could be formed by printing with an ink having insulating properties, such as an ultraviolet ray hardening ink having an acrylic denatured epoxy resin as a base resin to which is added a predetermined photo polymerization initiator (such as benzoin), or a thermo-hardening ink having an epoxy resin as a base resin to which is added an amine-type of hardener.

Instead of the above described materials, the isolation layer 14 could also be formed by a coating method or a printing method, such as ordinary gravure printing, roll printing, knife-edge printing, or offset printing, using a coloring material or an ink such that various colorants are added in accordance to the color required to a binder of a substance such as a cellulose derivative such as ethyl cellulose, cellulose nitrate, ethyl hydroxy ethyl cellulose, cellulose acetate propionate, or cellulose nitrate; a styrene resin or styrene copolymer resin such as polystyrene or poly-a-methyl styrene; a homopolymer or copolymer resin of an acrylic resin or methacrylic resin such as polymethyl methacrylate, polyethyl acrylate, or polybutyl acrylate; a rosin ester resin such as rosin, a rosin denatured maleinamic acid resin, a rosin denatured phenol resin, or a compound rosin; a polyvinyl acetate resin; a chroman resin; a vinyl toluene resin; a vinyl chloride resin, a polyester resin, a polyurethane resin, or a butyral resin; titanium oxide, alumina powder, or a microsilica is further added thereto, to improve the printing suitability thereof if necessary; and a plasticizer, a stabilizer, wax, grease, a drying agent, a drying supplementary agent, a hardener, or a thickening agent is further added thereto if necessary; and finally the coloring material or ink is mixed sufficiently with a solvent or dilutent.

The connection layer 15 is a layer that is formed to cover the isolation layer 14, and is for connecting the antenna circuit 13 and the IC chip 12. In other words, one end portion 15a of the connection layer 15 is connected to the IC chip 12 by the IC chip connection terminal 13c and the other end portion 15b thereof is connected to the antenna terminal 13b. The connection layer 15 is isolated from the antenna circuit 13 by the isolation layer 14 and the connection layer 15 is narrower than the isolation layer 14.

The connection layer 15 is formed by printing with an ink that has the same conductivity as the antenna circuit 13.

The first protective layer 16a is a layer formed over the entire surface of the card substrate 11, to protect the IC chip 12, the antenna circuit 13, and other components. The first protective layer 16a has an aperture 16c at a portion corresponding to the IC chip 12, which prevents the IC chip 12 from coming into direct contact with the first protective layer 16a. This ensures that the first protective layer 16a absorbs the thickness of the IC chip 12 to make the thickness of the card uniform. The first protective layer 16a can be configured of the same material as the card substrate 11.

The second protective layer 16b is a layer forming the upper surface of the card, and provided on the first protective layer 16a, for protecting the internal components such as the IC chip 12. The second protective layer 16b can also be formed of the same material as the card substrate 11. The second protective layer 16b could also have a pattern or like printed onto the surface thereof, to distinguish it from other cards.

The capacitor 17 is a component that is connected to the antenna circuit 13 which is formed on the card substrate 11, to tune the electromagnetic waves which will be received by the antenna circuit 13. The capacitor 17 has a first electrode layer 17a, a dielectric layer 17b, and a second electrode layer 17c, provided in that order from the card substrate 11 side.

The first electrode layer 17a is a layer that is printed with a conductive ink on top of the card substrate 11. The dielectric layer 17b is a layer printed with an insulating ink on top of the first electrode layer 17a. The second electrode layer 17c is a layer printed with conductive ink on top of the dielectric layer 17b. The first electrode layer 17a and the second electrode layer 17c sandwich the dielectric layer 17b to configure a capacitor.

Figure 2:
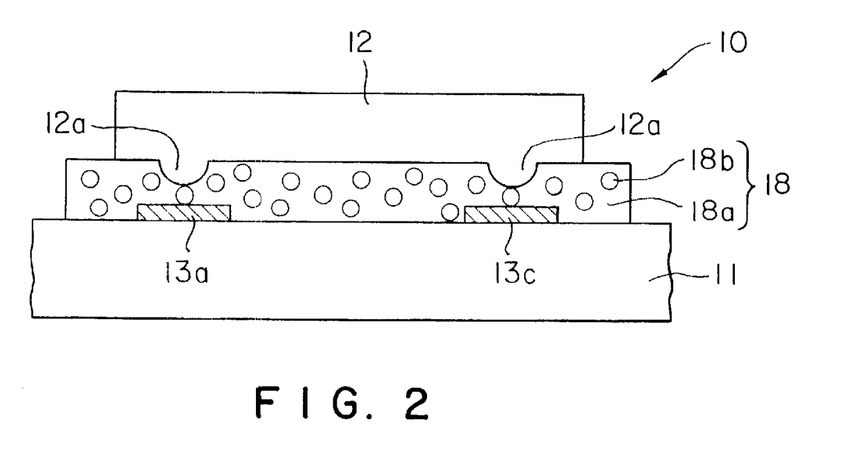
FIG. 2 is a cross-sectional view showing details of an anisotropic conductive contact film used in this embodiment of the invention.

A cross-sectional view of details of the anisotropic conductive adhesive film 18 used in this embodiment of the invention is shown in FIG. 2.

The anisotropic conductive adhesive film 18 is a film of a thickness on the order of several tens of $\mu$m (preferably approximately 25 $\mu$m) which is capable of becoming locally conductive. The anisotropic conductive adhesive film 18 has a resin layer 18a and conductive particles 18b dispersed within this resin layer 18a. The resin layer 18a is formed of a resin such as a thermo-hardening resin, a thermoplastic resin, or a mixture of the two. The conductive particles 18b are configured of plastic particles covered with a metal film, or the like.

As shown in FIG. 2, if the IC chip 12 that provided on the anisotropic conductive adhesive film 18 is pressed onto the antenna circuit 13, the parts of the film 18 that are sandwiched between the terminals 12a of the IC chip 12 and the antenna terminal 13a and the IC chip connection terminal 13c are compressed. This brings the terminals 12a into contact electrically with the antenna terminal 13a and the IC chip connection terminal 13c, through the conductive particles 18b.

The description now turns to a method of fabricating the noncontact IC card.

Figure 3:
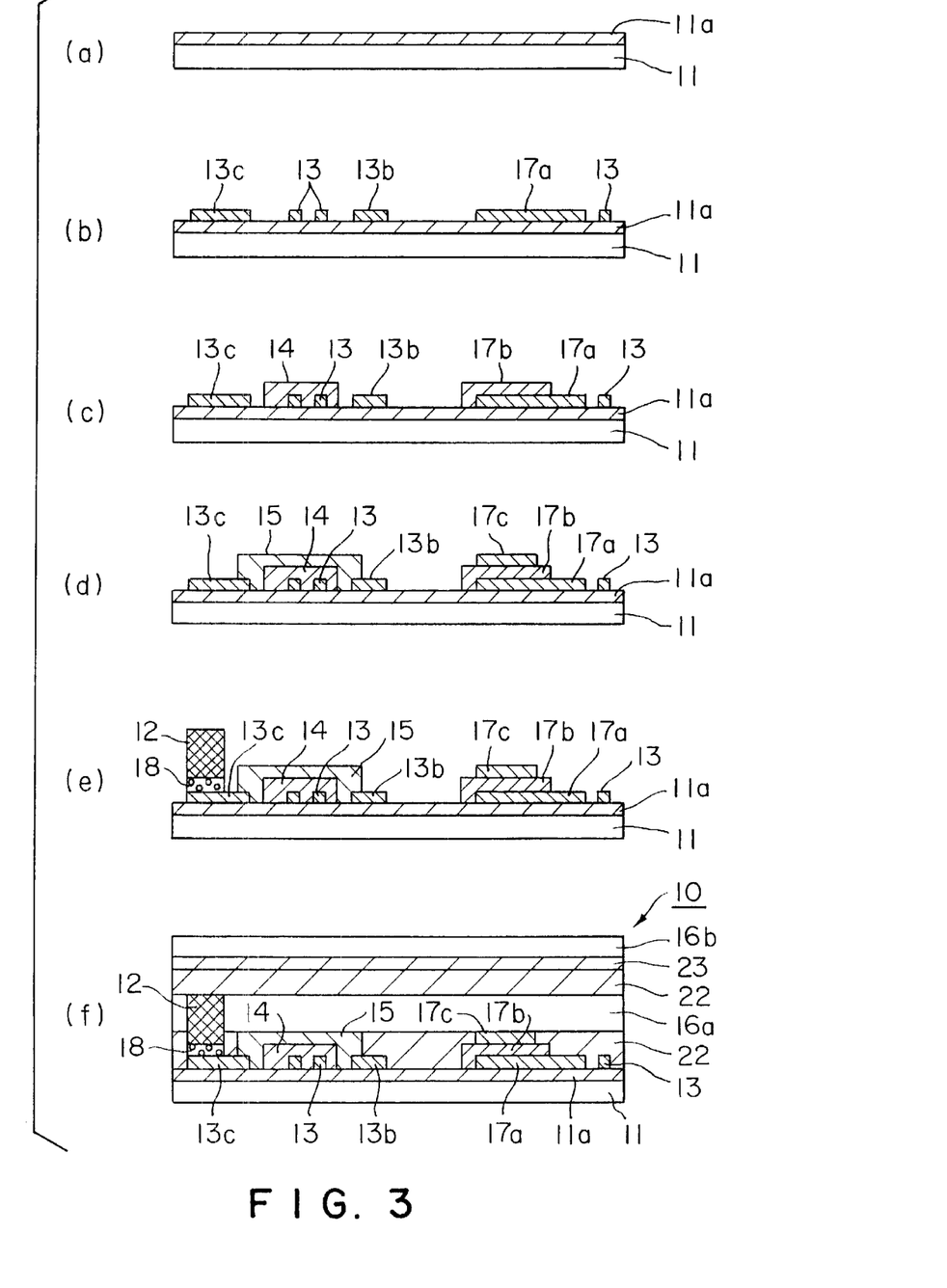
FIG. 3 illustrates the method of fabricating an embodiment of the noncontact IC card in accordance with this invention.

Diagrams illustrating the fabrication method in accordance with this embodiment of the noncontact IC card of this invention are shown in FIG. 3.

The noncontact IC card 10 is fabricated as follows:

(1) A 25-$\mu$m-thick adhesive layer 11a is coated onto the card substrate 11, which is a 188-$\mu$m-thick polyethylene terephthalate film (FIG. 3a: adhesive coating step).

(2) The antenna circuit 13, the IC chip connection terminal 13c, and the first electrode layer 17a of the capacitor 17 are screen-printed with a conductive ink onto the card substrate 11 that was coated with the adhesive layer 11a in step (1), then dried (FIG. 3b: first conductive printing step).

(3) The isolation layer 14 and the dielectric layer 17b are screen-printed with an insulating ink onto the antenna circuit 13 and the first electrode layer 17a that were formed in step (2), then dried (FIG. 3c: insulation printing step).

(4) The connection layer 15 and the second electrode layer 17c are screen-printed with a conductive ink onto the isolation layer 14 and the dielectric layer 17b formed in step (3), then dried (FIG. 3d: second conductive printing step).

(5) The IC chip 12 is heat-bonded on top of the antenna terminal 13a and the IC chip connection terminal 13c of the card substrate 11 on which is formed the connection layer 15, etc., in step (4), with the anisotropic conductive adhesive film 18 therebetween (FIG. 3e: IC chip mounting step).

(6) The first protective layer 16a, which is 250 $\mu$m thick, has the aperture 16c, and is coated on both sides with adhesive layers 22, is laid over the card substrate 11 on which is mounted the IC chip 12 in step (5). Then the second protective layer 16b, which is 188 $\mu$m thick and is coated on the lower side with an adhesive layer 23, is laid on the first protective layer 16a and the entire assembly is laminated by the application of heat and pressure (FIG. 3f: protective layer formation step).

(7) This completes the noncontact IC card 10, which has an overall thickness of 0.73 $\mu$m. In this case, the antenna circuit 13, the IC chip connection terminal 13c, and the first electrode layer 17a are disposed at the same level, the isolation layer 14 and the dielectric layer 17b are also disposed at the same level, and the connection layer 15 and the dielectric layer 17b are disposed at the same level.

In the above described embodiment of this invention, the antenna circuit 13 is formed on one side alone of the card substrate 11 and the first and second protective layers 16a and 16b are also formed on the same side of the card substrate 11, which makes it possible to fabricate the card inexpensively and with good mass-productivity. Since the antenna circuit 13 is formed by printing, the card can be made thinner.

As described in detail above, since the configuration of the present invention has the isolation layer formed over at least part of the antenna circuit and the connection layer formed to extend over that isolation layer, it is possible to configure the antenna circuit on only one side of the substrate.

In addition, the antenna circuit, connection layer, and isolation layer are formed by printing in accordance with the present invention, so they are thin and inexpensive.

Since the card in accordance with this invention also has a capacitor, it is possible to tune the electro-magnetic waves to be received thereby.

The capacitor in accordance with this invention is provided with a first electrode layer formed by printing with a conductive ink, a dielectric layer formed by printing with an insulating ink, and a second electrode layer formed by printing with a conductive ink, so it is thin and also inexpensive.

Since the method in accordance with this invention has a first conductive printing step of printing the antenna circuit and the first electrode layer, an insulation printing step of printing the isolation layer and the dielectric layer, and a second conductive printing step of printing the connection layer and the second electrode layer, it is possible to fabricate a thin noncontact IC card inexpensively therewith.

Second Embodiment

The present invention is not limited to the above described embodiment and thus it can be modified in various ways within the scope of the invention as laid out herein.

For example, a plurality of antenna circuits can be superimposed if it is necessary to form a number of windings of the antenna circuit 13 in order to obtain communications reliability.

In such a case, an additional isolation layer 20 is formed on top of the entire antenna circuit 13, except for the antenna terminals 13a and 13b, and an additional antenna circuit 21 is printed on top of the additional isolation layer 20. Repeating this process makes it possible to superimpose a plurality of antenna circuits.

If such a configuration is used, it is possible to easily obtain the necessary number of antenna coils, without using through-holes, by alternately printing predetermined patterns in the conductive ink and the insulating ink.

The protective layer could also be a single layer. This makes it possible to fabricate a more inexpensive card.

In such a case, a depression could be formed in the first protective layer 16a and the second protective layer 16b can be omitted, without affecting the IC chip 12.

Third Embodiment

A third embodiment of this invention will now be described with reference to FIGS. 4 to 6.

Figure 4:
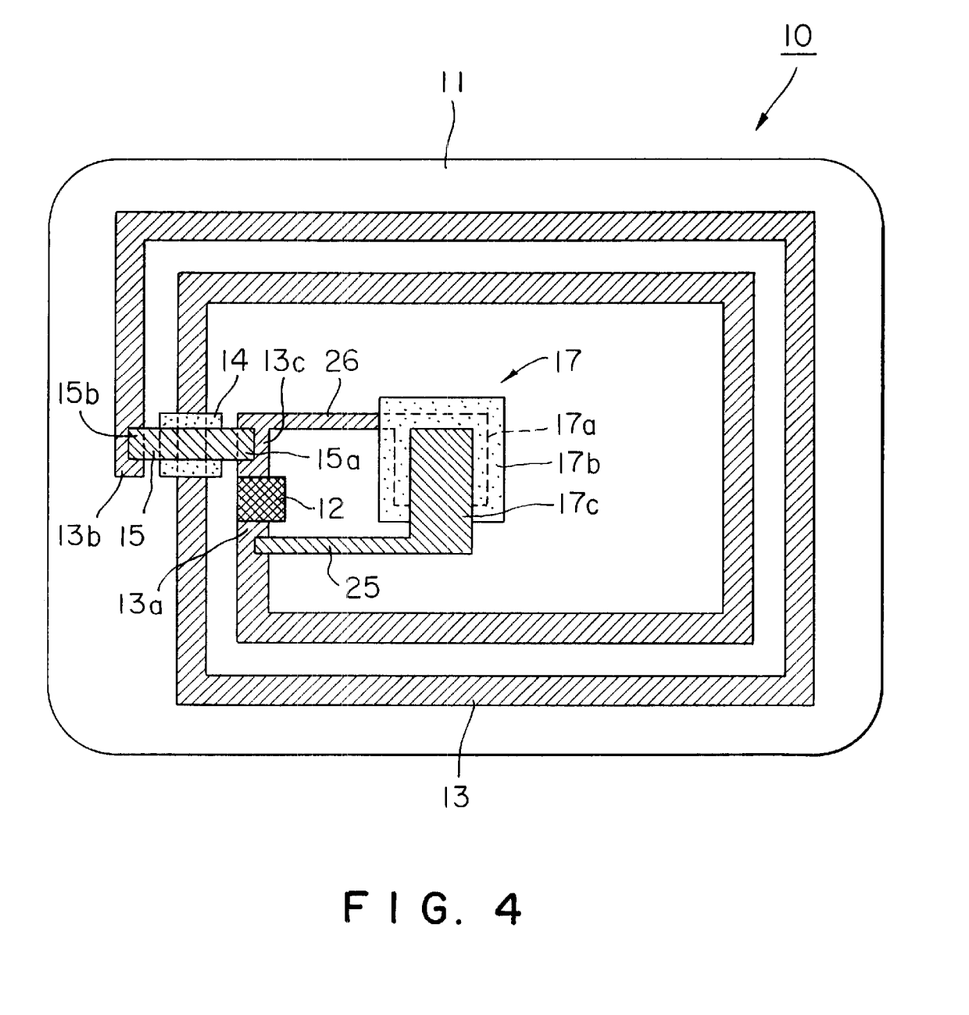
FIG. 4 shows a third embodiment of the noncontact IC card in accordance with this invention.
Figure 5:
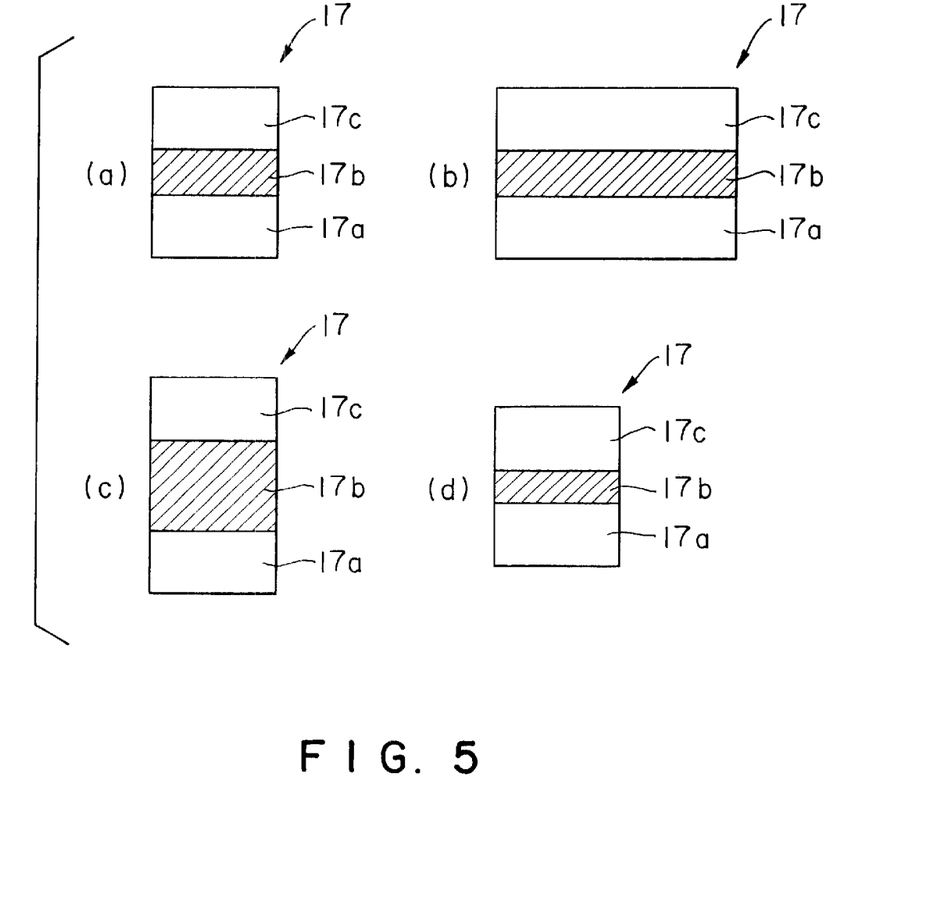
FIG. 5 shows alternative side views of the capacitor of the noncontact IC card in accordance with this invention.
Figure 6:
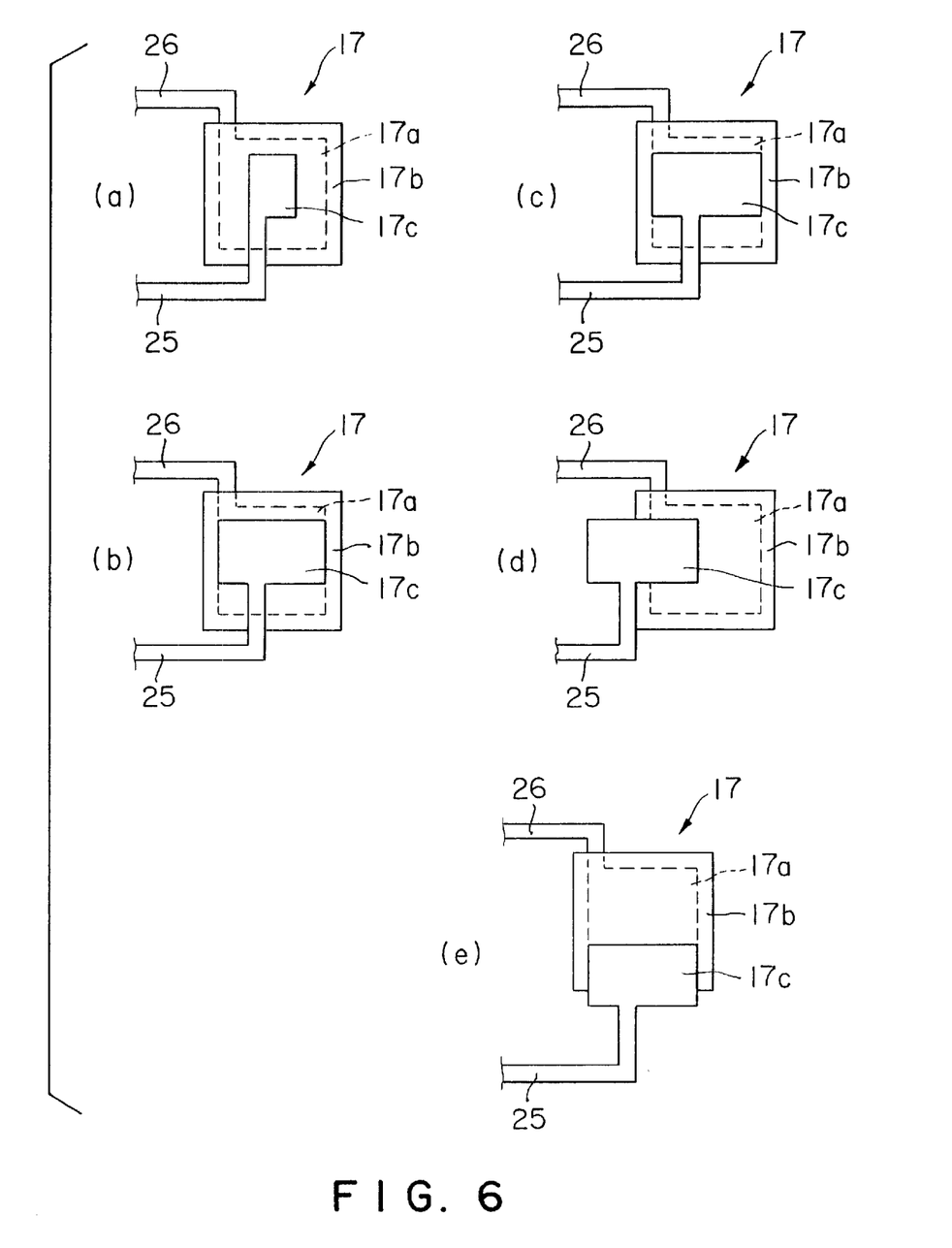
FIG. 6 shows alternative plan views of the capacitor of the noncontact IC card in accordance with this invention.

In the embodiment shown in FIGS. 4 to 6, only the dispositions of the IC chip 12 and the capacitor 17 are different from those in the first embodiment; other portions are the same as in the first embodiment shown in FIGS. 1 to 3.

As shown in FIG. 4, one antenna terminal 13a of the antenna circuit 13 is connected to the IC chip 12 and the other antenna terminal 13b of the antenna circuit 13 is connected to the connection layer 15 that is provided on top of the isolation layer 14.

The IC chip 12 is connected to one end portion 15a of the connection layer 15 by the IC chip connection terminal 13c, and the other end portion 15b of the connection layer 15 is connected to the antenna terminal 13b.

The capacitor 17 is connected to one antenna terminal 13a of the antenna circuit 13 by a first linking layer 25, and the capacitor 17 is also connected to one end portion 15a of the connection layer 15 by the IC chip connection terminal 13b and a second linking layer 26.

The capacitor 17 has the first electrode layer 17a which is printed integrally with the second linking layer 26 of the conductive ink, the dielectric layer 17b which is printed of the insulating ink, and the second electrode layer 17c which is printed integrally with the first linking layer 25 of the conductive ink.

Since each of the first electrode layer 17a, the dielectric layer 17b, and the second electrode layer 17c is printed by separate inks in this manner, the width and thickness of each layer can be determined arbitrarily (see FIGS. 5a to 5d). In other words, if the capacitor 17 has a reference width and thickness (see FIG. 5a), then doubling the width will double the capacity of the capacitor 17 (see FIG. 5a). Doubling the thickness of the dielectric layer 17b will halve the capacity of the capacitor 17 (see FIG. 5c). Furthermore, halving the thickness of the dielectric layer 17b will double the capacity of the capacitor 17 (see FIG. 5d).

In FIG. 4, the inductance L of the antenna circuit 13 is 1.2 $\mu$H and the capacitance C of the capacitor 17 is 20 pF. Once the IC chip 12 has been mounted, the resonant frequency is 13.56 MHz.

As shown in FIGS. 6a to 6e, the dispositions of the first electrode layer 17a, the dielectric layer 17b, and the second electrode layer 17c in plan view can be determined in any manner as desired.

Fourth Embodiment

Figure 7:
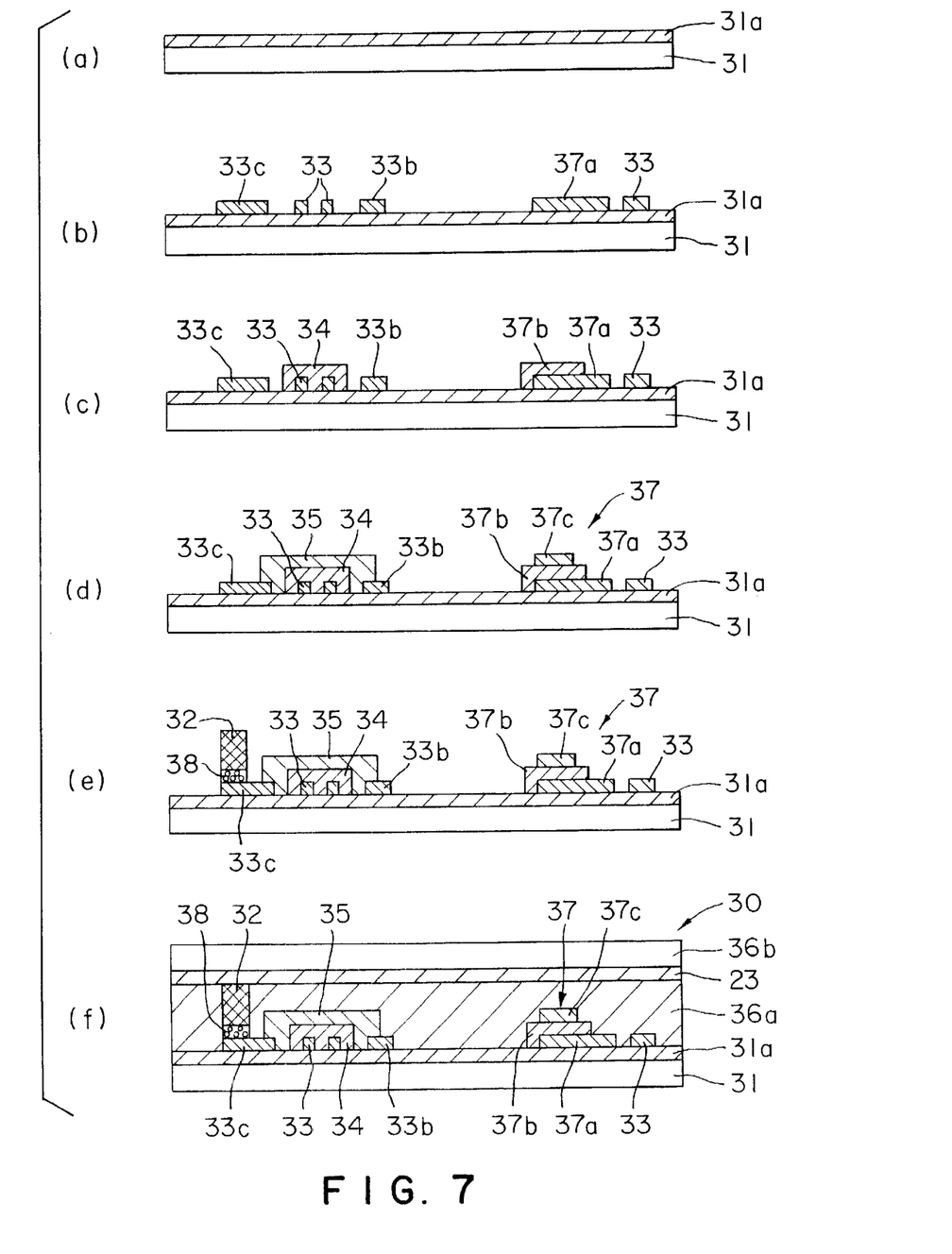
FIG. 7 shows a fourth embodiment of the noncontact IC card in accordance with this invention.

The description now turns to a fourth embodiment of the present invention, with reference to FIG. 7.

FIGS. 7a to 7f illustrate the fourth embodiment of the IC card in accordance with this invention. A noncontact IC card 30 is fabricated as follows:

(1) A 2-$\mu$m-thick adhesive layer 31a is coated onto a card substrate 31, which is a 100-$\mu$m-thick polyethylene terephthalate film (FIG. 7a: adhesive coating step).

(2) An antenna circuit 33, an IC chip connection terminal 33c, and a first electrode layer 37a of a capacitor 37 are screen-printed with a conductive ink onto the card substrate 31 that was coated with the adhesive layer 31a in step (1), then dried (FIG. 7b: first conductive printing step).

(3) An isolation layer 34 and a dielectric layer 37b are screen-printed with an insulating ink onto the antenna circuit 33 and the first electrode layer 37a that were formed in step (2), then dried (FIG. 7c: insulation printing step).

(4) A connection layer 35 and a second electrode layer 37c are screen-printed with a conductive ink onto the isolation layer 34 and the dielectric layer 37b formed in step (3), then dried (FIG. 7d: second conductive printing step).

(5) An IC chip 32 is heat-bonded on top of the antenna circuit 33 and the IC chip connection terminal 33c of the card substrate 31 on which is formed the connection layer 35, etc., in step (4), with an anisotropic conductive adhesive film 38 therebetween (FIG. 7e: IC chip mounting step).

(6) A first protective layer 36a formed of a thermally adhesive sheet that is 250 $\mu$m thick, is laid over the card substrate 31 on which is mounted the IC chip 32 in step (5). Then a second protective layer 36b, which is 100 μm thick and which is coated on the lower side with an adhesive layer 23, is laid on the first protective layer 36a and the entire assembly is laminated by the application of heat and pressure (FIG. 7f: protective layer formation step).

(7) This completes the noncontact IC card 30, which has an overall thickness of 0.45 μm.

Fifth Embodiment

Figure 8:
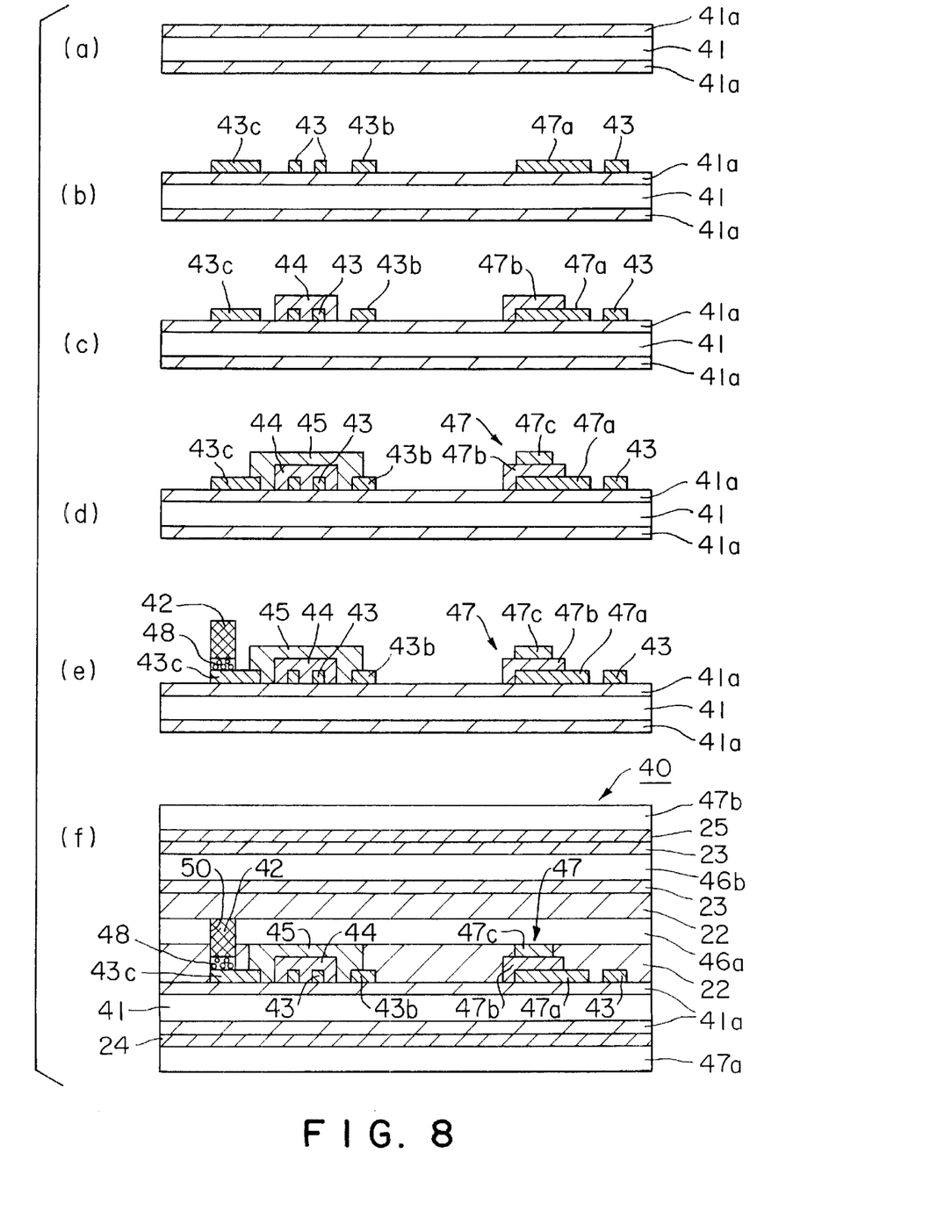
FIG. 8 shows a fifth embodiment of the noncontact IC card in accordance with this invention.

The description now turns to a fifth embodiment of the present invention, with reference to FIG. 8.

FIG. 8 illustrates the method of fabricating this embodiment of the IC card in accordance with the present invention. A noncontact IC card 40 is fabricated as follows:

(1) A 2-μm-thick adhesive layer 41a is coated onto a card substrate 41, which is a 100-μm-thick polyethylene terephthalate film (FIG. 8a: adhesive coating step).

(2) An antenna circuit 43, an IC chip connection terminal 43c, and a first electrode layer 47a of a capacitor 47 are screen-printed with a conductive ink onto the card substrate 41 that was coated with the adhesive layer 41a in step (1), then dried (FIG. 8b: first conductive printing step).

(3) An isolation layer 44 and a dielectric layer 47b are screen-printed with an insulating ink onto the antenna circuit 43 and the first electrode layer 47a that were formed in step (2), then dried (FIG. 8c: insulation printing step).

(4) A connection layer 45 and a second electrode layer 47c are screen-printed with a conductive ink onto the isolation layer 44 and the dielectric layer 47b formed in step (3), then dried (FIG. 8d: second conductive printing step).

(5) An IC chip 42 is heat-bonded on top of the antenna circuit 43 and the IC chip connection terminal 43c of the card substrate 41 on which is formed the connection layer 45, etc., in step (4), with an anisotropic conductive adhesive film 48 therebetween (FIG. 8e: IC chip mounting step).

(6) A first protective layer 46a formed of a thermally adhesive sheet that is 250 μm thick, which has an aperture 50 for the IC chip 42 and is coated on both sides with adhesive layers 22, is laid over the card substrate 41 on which is mounted the IC chip 42 in step (5). Then a second protective layer 46b, which is 100 μm thick and which is coated on the lower side with an adhesive layer 23, is laid on the first protective layer 46a. In addition, a first patterned protective layer 57a, which is 150 μm thick and which is coated with a 2-μm-thick adhesive layer 24 is superimposed from a lower side and a second patterned protective layer 57b, having a similar adhesive layer 24, is superimposed from above, and the entire assembly is laminated by the application of heat and pressure (FIG. 8f: protective layer formation step).

(7) This completes the noncontact IC card 40, which has an overall thickness of 0.75 μm.

This embodiment of the present invention has the patterned layers 57a and 57b, on which is printed a pattern, on the upper and lower surfaces thereof, making it possible to create card that have a basic structure which is unchanged, but which have a different patterns. The patterned layers 57a and 57b could also indicate the information within the IC chip 12.

In addition to improving the mass-productivity, this makes it possible to fabricate small lots with many features, or improve the functions of the IC card.

What is claimed is:

1. A noncontact IC card comprising:
   a card substrate;
   an IC chip located on one surface of said card substrate;
   an antenna circuit having a pair of antenna terminals located on the same surface of said card substrate as said IC chip, where one terminal is connected to said IC chip;
   an isolation layer located so as to cover a portion of said antenna circuit;
   a connection layer located on said isolation layer and having a pair of end portions, one end portion being connected to said IC chip and the other end portion being connected to the other antenna terminal; and
   a protective layer located on top of said card substrate, for protecting said IC chip, said antenna circuit, and said connection layer.

2. The noncontact IC card according to claim 1, wherein said antenna circuit and said connection layer are conductive ink layers; and
   said isolation layer is an insulating ink layer.

3. The noncontact IC card according to claim 1, further comprising a capacitor connected to said antenna circuit and located on the same surface of said card substrate as said antenna circuit.

4. The noncontact IC card according to claim 3, wherein said capacitor has a first electrode layer of conductive ink, a dielectric layer of insulating ink located on said first electrode layer, and a second electrode layer of conductive ink located on said dielectric layer.

5. The noncontact IC card according to claim 1, further comprising an additional antenna circuit and an additional isolation layer, said additional antenna circuit located on said antenna circuit and isolated from said antenna circuit by said additional isolation layer.

6. The noncontact IC card according to claim 1, wherein said protective layer has a first protective layer located on said one surface of said card substrate and a second protective layer located on said first protective layer.

7. The noncontact IC card according to claim 6, wherein said first protective layer includes an aperture for locating therein at least part of said IC chip.

8. The noncontact IC card according to claim 6, wherein said first protective layer is a thermo-adhesive sheet.

9. The noncontact IC card according to claim 1, further comprising pattern layers on outer sides of said card substrate and said protective layer.

10. The noncontact IC card according to claim 3, wherein said capacitor is connected to one antenna terminal of said antenna circuit and one end portion of said connection layer.

11. The noncontact IC card according to claim 10, wherein said capacitor is connected to one antenna terminal of said antenna circuit by a first linking layer and to one end portion of said connection layer by a second linking layer.

12. The noncontact IC card according to claim 4, wherein said antenna circuit and said first electrode layer of said capacitor are located on a same plane surface, said isolation layer and said dielectric layer of said capacitor are located on a same plane surface, and said connection layer and said second electrode layer of said capacitor are located on a same plane surface.

13. A method of fabricating a noncontact IC card having a card substrate with an IC chip, an antenna circuit, and a capacitor located on said card substrate, wherein said IC chip and said antenna circuit are connected by a connection layer located on an isolation layer located on said antenna circuit, said fabrication method comprising the steps of:

first conductive printing an antenna circuit and a first electrode layer onto predetermined locations of one surface of a card substrate;

insulation printing an isolation layer onto at least part of said antenna circuit formed by said first conductive printing step, and also printing a dielectric layer on said first electrode layer formed by said first conductive printing step; and second conductive printing a connection layer on said isolation layer formed by said insulation printing step and also printing a second electrode layer on said dielectric layer formed by said insulation printing step, to form a capacitor.

14. The method of fabricating a noncontact IC card according to claim 13, further comprising a step of locating a protective layer on top of said card substrate, for protecting an IC chip, said antenna circuit, said isolation layer, and said connection layer.

* * * * *